United States Patent
Inaba et al.

(10) Patent No.: US 10,821,835 B2
(45) Date of Patent: Nov. 3, 2020

(54) SELF-COOLED REACTOR APPARATUS

(71) Applicant: MITSUBISHI ELECTRIC CORPORATION, Tokyo (JP)

(72) Inventors: Satoshi Inaba, Tokyo (JP); Yuki Ishimori, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 283 days.

(21) Appl. No.: 15/762,632

(22) PCT Filed: Oct. 9, 2015

(86) PCT No.: PCT/JP2015/078809
§ 371 (c)(1),
(2) Date: Mar. 23, 2018

(87) PCT Pub. No.: WO2017/061045
PCT Pub. Date: Apr. 13, 2017

(65) Prior Publication Data
US 2018/0268980 A1    Sep. 20, 2018

(51) Int. Cl.
*H01F 27/02* (2006.01)
*B60L 9/00* (2019.01)
(Continued)

(52) U.S. Cl.
CPC .............. *B60L 9/005* (2013.01); *B60K 11/06* (2013.01); *B60L 3/00* (2013.01); *B61C 17/00* (2013.01);
(Continued)

(58) Field of Classification Search
USPC .......................................................... 336/59
See application file for complete search history.

(56) References Cited

U.S. PATENT DOCUMENTS

| 8,009,005 B2* | 8/2011 | Hara ...................... B60L 5/005 336/65 |
| 2010/0301986 A1 | 12/2010 | Hara et al. |
| 2014/0232331 A1* | 8/2014 | Stamenic .................. B60L 1/02 320/108 |

(Continued)

FOREIGN PATENT DOCUMENTS

| JP | S58-202150 A | 11/1983 |
| JP | H05-234774 A | 9/1993 |

(Continued)

OTHER PUBLICATIONS

Extended European Search Report dated Apr. 29, 2019, issued by the European Patent Office in corresponding European Application No. 15905864.3. (7 pages).

(Continued)

*Primary Examiner* — Ronald Hinson
(74) *Attorney, Agent, or Firm* — Buchanan Ingersoll & Rooney PC

(57) ABSTRACT

A self-cooled reactor apparatus includes: a pair of frames attached to a vehicular mount, a coil disposed between the pair of frames and fixed to the frames, a cover disposed between the pair of frames, and a protective member. The coil is covered by the cover having at least a portion thereof in which through-holes are formed. The protective member, while retaining a flow passage for air from the through-holes to the coil, blocks a space between the through-hole and the coil in a penetration direction of the through-holes.

3 Claims, 7 Drawing Sheets

(51) Int. Cl.
*B61C 17/00* (2006.01)
*H01F 27/08* (2006.01)
*B60L 3/00* (2019.01)
*H01F 37/00* (2006.01)
*H05K 7/20* (2006.01)
*B60K 11/06* (2006.01)
*H01F 27/28* (2006.01)

(52) U.S. Cl.
CPC ........... *H01F 27/025* (2013.01); *H01F 27/08* (2013.01); *H01F 27/085* (2013.01); *H01F 37/00* (2013.01); *H05K 7/20* (2013.01); *H01F 27/28* (2013.01)

(56) References Cited

U.S. PATENT DOCUMENTS

2016/0130851 A1* 5/2016 Storm ................... B60L 50/53 49/31
2018/0099576 A1* 4/2018 Iwamoto ............... B60L 53/124

FOREIGN PATENT DOCUMENTS

| JP | H06-92226 A | 4/1994 |
| JP | H09-263239 A | 10/1997 |
| JP | 2003-163122 A | 6/2003 |
| JP | 2015-100750 A | 6/2015 |
| WO | WO 2008/152710 A1 | 12/2008 |

OTHER PUBLICATIONS

International Search Report (PCT/ISA/210) dated Jan. 12, 2016, by the Japan Patent Office as the International Searching Authority for International Application No. PCT/JP2015/078809.

Written Opinion (PCT/ISA/237) dated Jan. 12, 2016, by the Japan Patent Office as the International Searching Authority for International Application No. PCT/JP2015/078809.

Office Action dated Jul. 18, 2017, issued by the Japan Patent Office for Japanese Patent Application No. 2017-533639.

* cited by examiner

SELF-COOLED REACTOR APPARATUS

TECHNICAL FIELD

The present disclosure relates to a self-cooled reactor apparatus mounted on a vehicle and cooled by traveling airflow.

BACKGROUND ART

A reactor apparatus is mounted above the roof or under the floor of a railway vehicle. The reactor apparatus has a coil for suppression of large changes in electric current, and the coil is used to suppress changes in, for example, a high frequency switching current, a ground fault current, or the like. Temperature of the coil rises when heat of resistance is generated by current flowing through the coil. When an air blower is provided to cool the coil in order to suppress the rise in temperature of the coil, problems occur such as increased maintenance work due to added of the air blower and increased noise due to the electric motor used in the air blower. Thus self-cooled reactor apparatuses are widely used that do not use an air blower.

The coil is cooled by air convection in the case of the self-cooled reactor apparatus, and thus metallic thin plates with holes are used for a housing. In a vehicular reactor disclosed in Patent Literature 1, a winding wire is surrounded by a protective cover, and at least a portion of the protective cover is formed by a twisted-wire magnetic shield member having a wire mesh shape formed by lining up the twisted wires in a venetian blind-like pattern.

CITATION LIST

Patent Literature

Patent Literature 1: Unexamined Japanese Patent Application Kokai Publication No. 2003-163122

SUMMARY OF INVENTION

Technical Problem

For the vehicular reactor disclosed in Patent Literature 1, there are instances in which damage occurs to the coil due to foreign objects smaller than mesh holes, or when the vehicular reactor is placed in the floor, damage occurs to the coil due to the protective cover deforming due to contact with foreign objects.

The present disclosure is developed in consideration of the aforementioned circumstances, and an objective of the present disclosure is to protect the coil while maintaining cooling performance.

Solution to Problem

In order to attain the aforementioned objective, the self-cooled reactor apparatus includes: a pair of opposed frames, a coil, a cover, and a protective member. The pair of frames is attached to a vehicle. The coil is arranged between the pair of frames and is fixed to the frames. The cover is arranged between the pair of frames, covers the coil, and has through-holes formed in at least a portion thereof. The protective member, while retaining a flow passage for air from the through-hole to the coil, blocks a space between the through-hole and the coil in a penetration direction of the through-hole. The protective member is at least a pair of members extending so as to approach one another from an air-intake surface in a travel direction of the vehicle. The air-intake surface is a surface of the cover positioned opposite to the vehicle relative to the coil.

Advantageous Effects of Invention

According to the present disclosure, the protective member is provided that, while retaining a flow passage for air from the through-hole to the coil, blocks the space between the through-hole and the coil in the penetration direction of the through-hole, thereby enabling protection of the coil while maintaining cooling performance.

DESCRIPTION OF EMBODIMENTS

Figure 1:
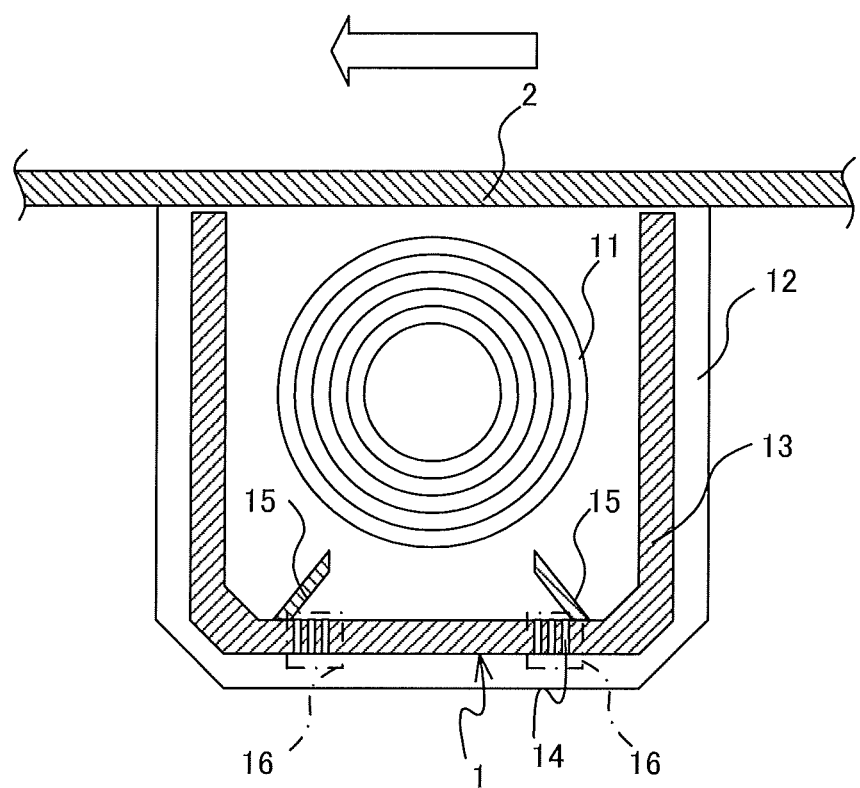
FIG. 1 is a cross-sectional view of a self-cooled reactor apparatus according to an embodiment of the present disclosure.

Embodiments of the present disclosure are described below in detail in reference to drawings. In the drawings, components that are the same or equivalent are assigned the same reference signs.

Figure 2:
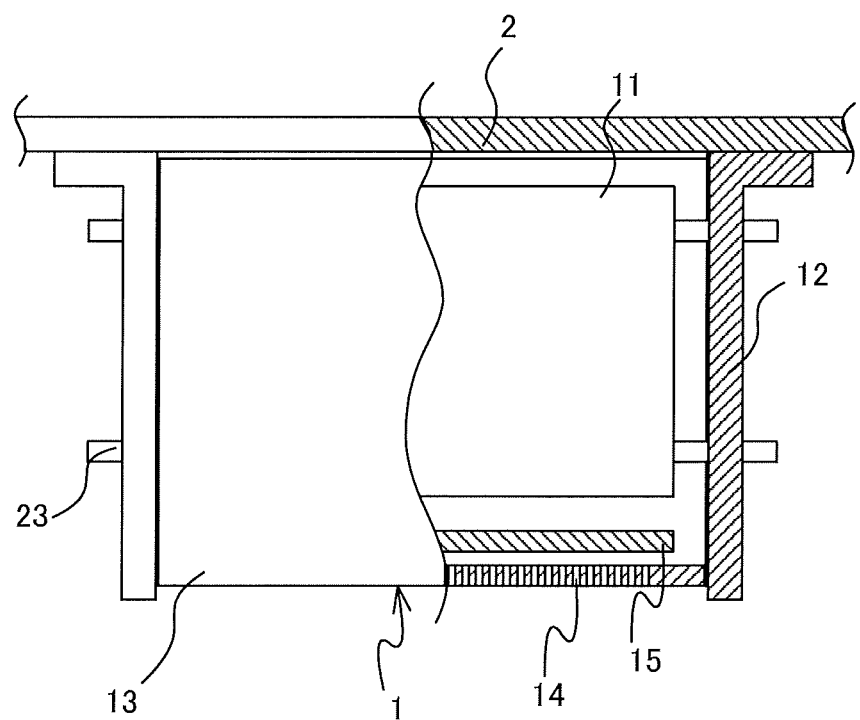
FIG. 2 is a partial cross-sectional view of the self-cooled reactor apparatus according to the embodiment.

FIG. 1 is a cross-sectional view of a self-cooled reactor apparatus according to an embodiment of the present disclosure. A self-cooled reactor apparatus 1 is arranged above the roof or under the floor of a vehicle. FIG. 1 is a cross-sectional view taken along a travel direction of the vehicle. In the example of FIG. 1, the self-cooled reactor apparatus 1 is attached to a lower surface of a vehicular mount 2 under the floor of the vehicle. The outlined-type arrow symbol in FIG. 1 indicates the direction of travel of the vehicle. FIG. 2 is a partial cross-sectional view of the self-cooled reactor apparatus according to the embodiment. FIG. 2 is a view of the self-cooled reactor apparatus 1 as seen from the direction of travel of the vehicle. The coil 11 included in the self-cooled reactor apparatus 1 is covered by a cover 13 that has through-holes 14 formed in at least a portion of the cover 13. Protective members 15, while retaining a flow passage for air from the through-holes 14 to the coil 11, block a space between the through-holes 14 and the coil 11 in a penetration direction of the through-holes 14. Thus the coil 11 can be protected while maintaining cooling performance.

The self-cooled reactor apparatus 1 includes the coil 11, a pair of frames 12 attached to the vehicular mount 2, the cover 13 having through-holes 14 formed therein, and the protective member 15. The pair of frames 12 opposes one another with the coil 11 interposed therebetween. The coil 11 is arranged between the pair of frames 12 and is fixed to the frames 12 by bolts 23 through a non-illustrated insulating member. Although the coil 11 is an air-core coil in the example of FIG. 1 and FIG. 2, a core-equipped coil may be used. In the example of FIG. 1 and FIG. 2, the coil 11 is disposed so that a central axis of the coil 11 is perpendicular to the travel direction of the vehicle. The cover 13 is arranged between the pair of frames 12 and covers the coil 11, and the through-holes 14 are framed in at least a portion of the cover 13. The protective member 15, while retaining a flow passage for air from the through-holes 14 to the coil 11, blocks the space between the through-holes 14 and the coil 11 in the penetration direction of the through-holes 14.

In the example of FIG. 1 and FIG. 2, the through-holes 14 are formed in an air-intake surface that is a surface of the cover 13 positioned, with respect to the coil 11, at the side opposite from the vehicle; that is to say, the through-holes 14 are formed in hole-forming portions 16 that are located in a bottom surface of the cover 13 at both ends of the cover 13 in the travel direction of the vehicle. In FIG. 1, the hole-forming portions 16 are the portions surrounded by the dot-dashed lines. In the example of FIG. 2, in the bottom surface of the cover 13, the through-holes 14 are formed side-by-side in a direction perpendicular to the travel direction of the vehicle. The protective member 15, while retaining the flow passage for air from the through-holes 14 to the coil 11, blocks the space between the through-holes 14 and the coil 11 in the penetration direction of the through-holes 14, the penetration direction being the vertical direction in FIG. 1 and FIG. 2. In the example of FIG. 1 and FIG. 2, the protective member 15 is a pair of plate-like members extending so as to approach one another from both ends of the air-intake surface in the travel direction of the vehicle. The protective member 15 is formed from members having roughly the same toughness as the members forming the cover 13. 2 to 3 mm thick iron may be used for the protective member 15.

When the vehicle travels, traveling airflow enters the interior of the cover 13 through the through-holes 14 from the exterior of the cover 13, flows along the protective member 15, arrives at the coil 11, and flows through the coil 11 out to the exterior of the cover 13 from a gap between the cover 13 and the vehicular mount 2, thereby cooling the coil 11. The protective member 15 blocks the space between the through-holes 14 and the coil 11 in the penetration direction of the through-holes 14, thereby enabling prevention of foreign objects from entering the interior of the cover 13 from the through-holes 14. Further, when the self-cooled reactor apparatus 1 is placed at the floor, even when a hole-forming portion 16 of the cover 13 is deformed by foreign objects at the floor, damage to the coil 11 due to deformation of the cover 13 can be prevented. That is to say, due to providing of the protective member 15, while cooling the coil 11, damage to the coil 11 due to entry of foreign objects from the through-holes 14 or due to deformation of the cover 13 can be prevented.

Figure 3:
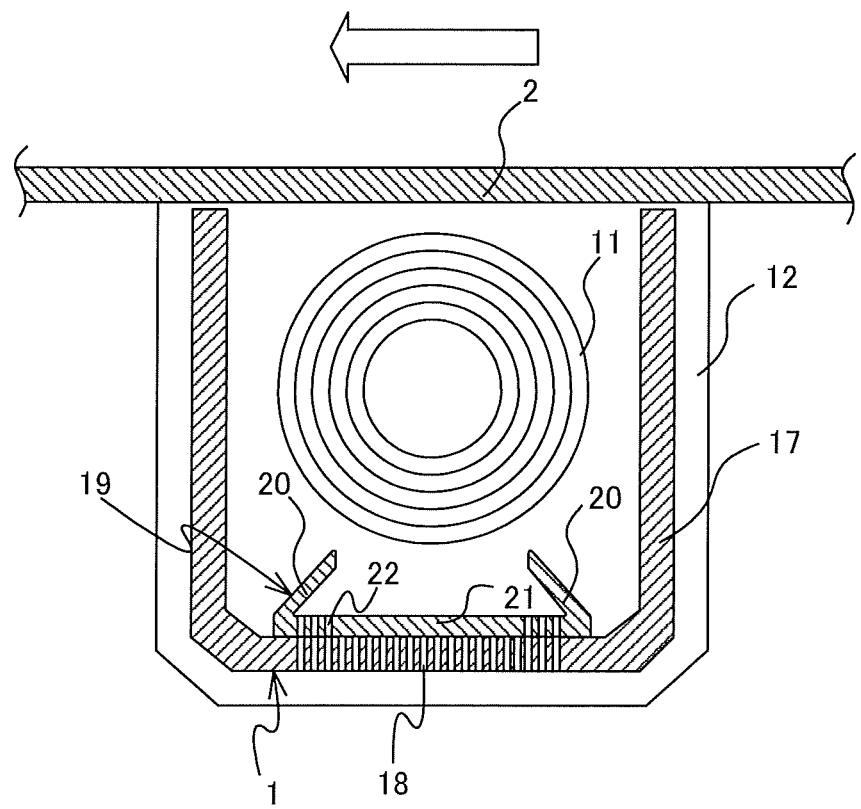
FIG. 3 is a cross-sectional view of the self-cooled reactor apparatus according to a different example of the embodiment.
Figure 4:
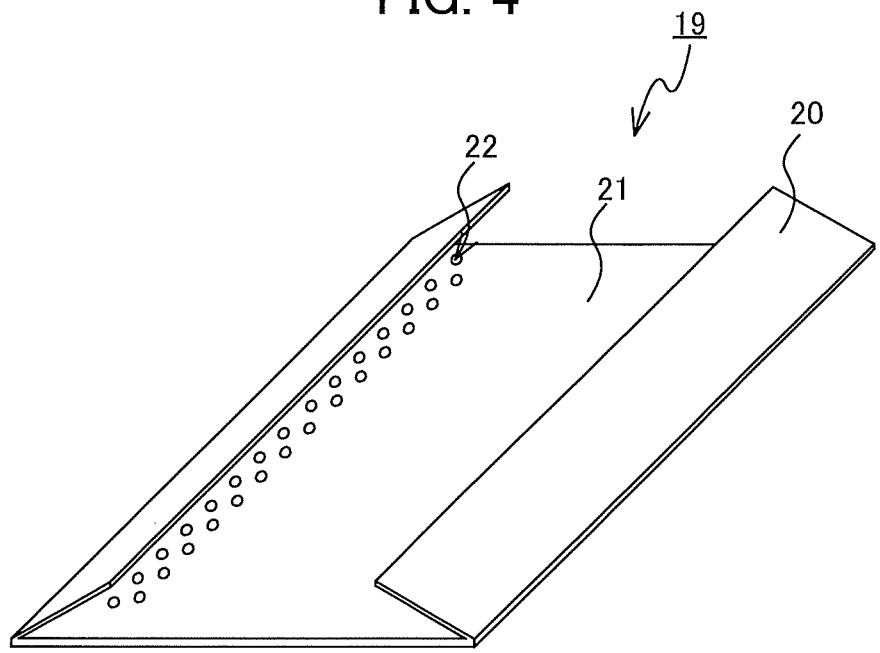
FIG. 4 is a perspective view of a protective plate according to the different example of the embodiment.
Figure 5:
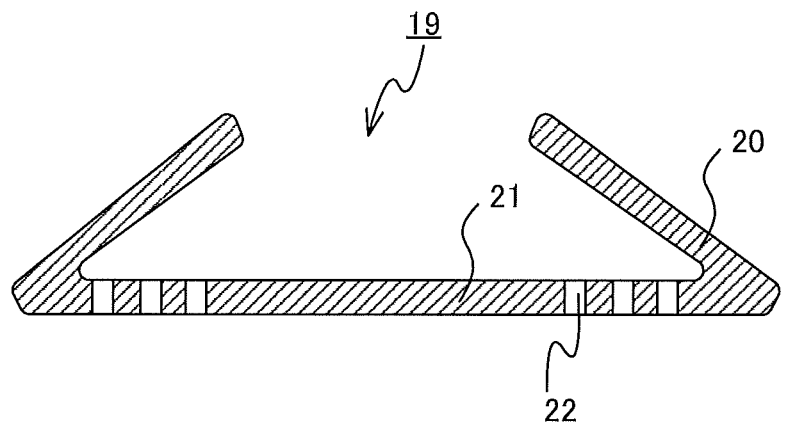
FIG. 5 is a cross-sectional view of the protective plate according to the different example of the embodiment.
Figure 6:
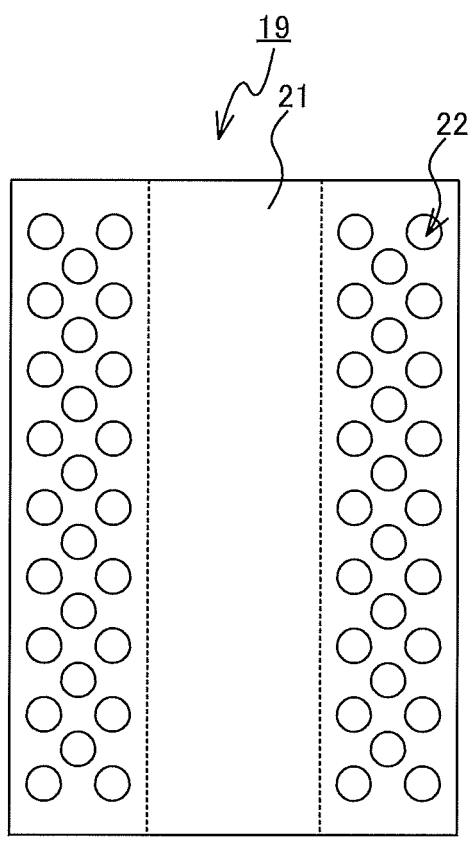
FIG. 6 is a bottom view of the protective plate according to the different example of the embodiment.

In the example of FIG. 1 and FIG. 2, although the protective member 15 is attached to the cover 13 as a pair of plate-like members, a protective plate obtained by working a single plate may be used to protect the coil 11. FIG. 3 is a cross-sectional view of a self-cooled reactor apparatus according to a different example of the embodiment. In the self-cooled reactor apparatus 1 illustrated in FIG. 3, the coil 11 is protected by a cover 17 to which a protective plate 19 is attached. FIG. 4 is a perspective view of a protective plate according to the different example of the embodiment; FIG. 5 is a cross-sectional view of the protective plate according to the different example of the embodiment; and FIG. 6 is a bottom view of the protective plate according to the different example of the embodiment. Both ends of the protective plate 19 are bent over so as to approach one another, bent-over portions 20 are positioned so as to block the penetration direction of through-holes 22 formed in a central portion 21, and the bent-over portions 20 correspond to the protective member 15 of FIG. 1. The cover included in the cover 17 and the central portion 21 of the protective plate 19 is equivalent to the cover 13 of FIG. 1 and FIG. 2. The through-holes included in through-holes 18 formed in the cover 17 and the through-holes 22 formed in the central portion 21 of the protective plate 19 correspond to the through-holes 14 of FIG. 1 and FIG. 2. The bent-over portions 20 of the protective plate 19 protect the coil 11 by blocking the space, between the coil 11 and the through-holes included in the through-holes 18 and the through-holes 22, in the penetration direction of such through-holes.

In the example of FIG. 6, although circular through-holes 22 are formed one-after-another in a direction parallel to lines of the bending over of the protective plate 19, the shape and layout method of the through-holes 22 are not limited to those of the example of FIG. 6. The through-holes 22 may be slit-shaped, oblong-shaped, or rectangular-shaped; and layout is not limited to the staggered-hole pattern as illustrated in FIG. 6, and a vertically-aligned-square-lattice-shaped layout may be used.

Figure 7:
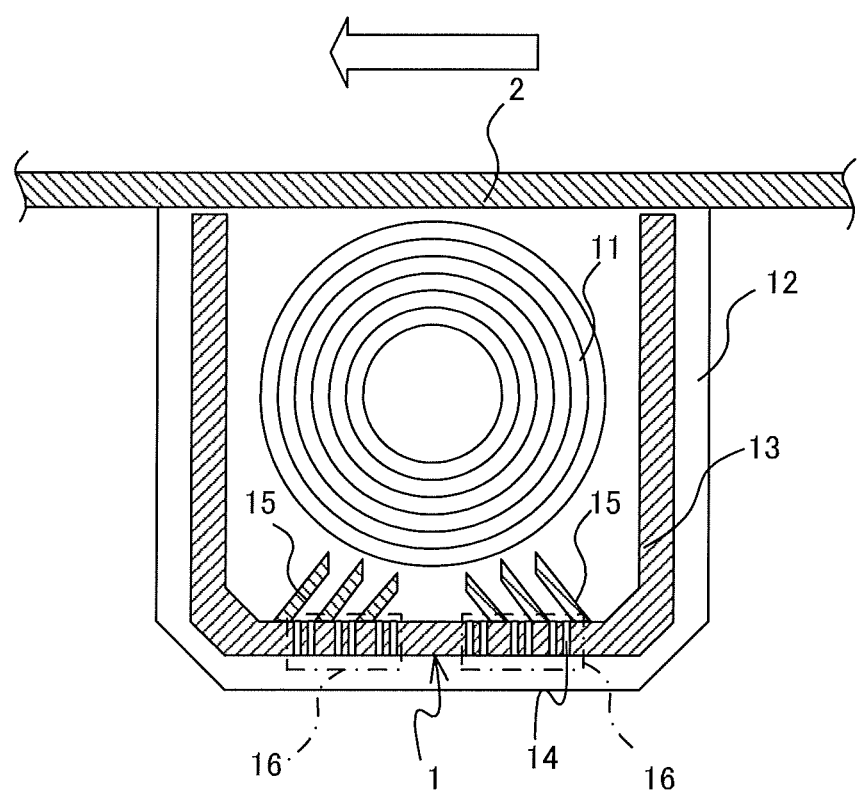
FIG. 7 is a cross-sectional view of a self-cooled reactor apparatus according to a Modified Example 1 of the embodiment.

The shape of the protective member 15 is not limited to the shape of the above example. FIG. 7 is a cross-sectional view of a self-cooled reactor apparatus according to a Modified Example 1 of the embodiment. For the self-cooled reactor apparatus 1 illustrated in FIG. 7, in the hole-forming portions 16 of the bottom surface, which is the air-intake surface, of the cover 13, the through-holes 14 are formed side-by-side in a direction perpendicular to the travel direction of the vehicle. In the example of FIG. 7, the protective member 15 is a plurality of pairs of plate-like members extending so as to approach one another from the both end portions of the bottom surface of the cover 13 in the travel direction of the vehicle.

Figure 8:
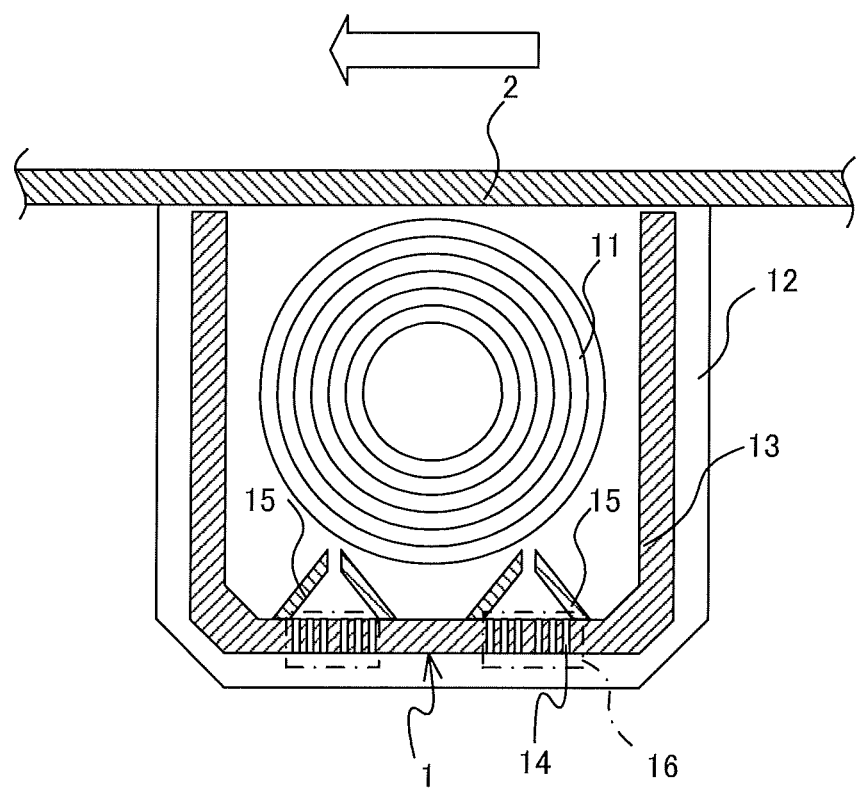
FIG. 8 is a cross-sectional view of a self-cooled reactor apparatus according to a Modified Example 2 of the embodiment.

FIG. 8 is a cross-sectional view of a self-cooled reactor apparatus according to a Modified Example 2 of the embodiment. For the self-cooled reactor apparatus 1 illustrated in FIG. 8, at each of a plurality of the hole-forming portions 16 included in the bottom surface, which is the air-intake surface, of the cover 13, the through-holes 14 are formed side-by-side in a direction perpendicular to the travel direction of the vehicle. For each of the hole-forming portions 16, a protective member 15 is provided that is a pair of plate-like members extending so as to approach one another from both ends of the hole-forming portion 16 in the travel direction of the vehicle. The number of the hole-forming portions 16 is not limited to two. Further, a respective protective plate 19 illustrated in FIG. 4 may be provided for each of the hole-forming portions 16.

Figure 9:
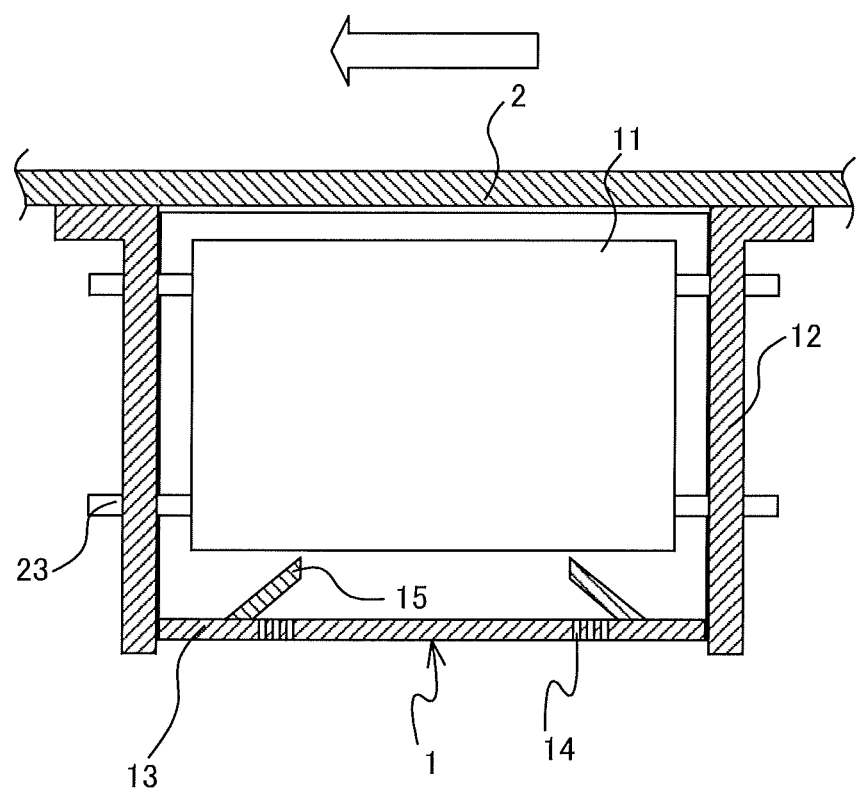
FIG. 9 is a cross-sectional view of a self-cooled reactor apparatus according to a Modified Example 3 of the embodiment.

The direction of arrangement of the coil 11 is not limited to that of the aforementioned embodiments. FIG. 9 is a cross-sectional view of a self-cooled reactor apparatus according to a Modified Example 3 of the embodiment. As illustrated in FIG. 9, the coil 11 may be fixed via bolts 23 to the frames 12 such that the central axis of the coil 11 is parallel to the travel direction of the vehicle. Also in the case of the central axis of the coil 11 that is parallel to the travel direction of the vehicle, the shape of protective member 15 is not limited to the example illustrated in FIG. 9, but rather the protective plate 19 illustrated in FIG. 4 may be provided, or the protective members 15 illustrated in FIG. 7 and FIG. 8 may be provided.

As described above, by use of the self-cooled reactor apparatus 1 according to the embodiments, a protective member 15 is provided that blocks the space between the through-holes 14 and the coil 11 in the penetration direction of the through-holes 14, thereby enabling protection of the coil 11 while maintaining cooling performance. Further, by attachment of the protective plate 19 illustrated in FIG. 4 to the cover of a previously-existing self-cooled reactor apparatus, protection of the coil is enabled while maintaining cooling performance even for the previously-existing self-cooled reactor apparatus.

By intake of traveling airflow into the interior of the cover 13 and cooling the coil 11, the external-shape dimensions of the coil 11 can be reduced, and size reduction and weight reduction of the self-cooled reactor apparatus 1 are possible.

The present disclosure is not limited to the aforementioned embodiments. The protective member 15 is not limited to the plate-like components. Further, the protective member 15 may be a member that extends from the side surfaces of the cover 13 and along the bottom surface of the cover 13. Further, through-holes for intake of air into the interior of the cover 13 may also be provided in the side surface of the cover 13.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

REFERENCE SIGNS LIST

1 Self-cooled reactor apparatus
2 Vehicular mount
11 Coil
12 Frame
13, 17 Cover
14, 18, 22 Through-holes
15 Protective member
16 Hole-forming portion
19 Protective plate
20 Bent-over portion
21 Central portion
23 Bolt

The invention claimed is:

1. A self-cooled reactor apparatus comprising:
a pair of opposed frames to attach to a vehicle;
a coil fixed to the frames and disposed between the pair of frames;
a cover disposed between the pair of frames to cover the coil, the cover having through-holes formed in at least a portion thereof; and
a protective member to, while retaining a flow passage for air from the through-holes to the coil, block a space between the through-holes and the coil in a penetration direction of the through-holes;
wherein the protective member is at least a pair of members extending so as to approach one another from an air-intake surface in a travel direction of the vehicle, the air-intake surface being a surface of the cover positioned opposite to the vehicle relative to the coil.

2. The self-cooled reactor apparatus according to claim 1, wherein
the through-holes are formed in hole-forming portions side-by-side in a direction perpendicular to a travel direction of the vehicle, the hole-forming portions being disposed at both end portions of the air-intake surface in the travel direction of the vehicle, and
the protective member is at least a pair of plate-like members extending so as to approach one another from the both end portions of the air-intake surface in the travel direction of the vehicle.

3. The self-cooled reactor apparatus according to claim 1, wherein
the through-holes are formed in each of a plurality of hole-forming portions side-by-side in a direction perpendicular to a travel direction of the vehicle, the plurality of hole-forming portions being in an air-intake surface, and
the protective member is disposed at each of the plurality of hole-forming portions and is a pair of plate-like members extending so as to approach one another from both end portions of each of the hole-forming portions in the travel direction of the vehicle.

* * * * *